United States Patent
Gillingham

(10) Patent No.: US 8,122,202 B2
(45) Date of Patent: Feb. 21, 2012

(54) REDUCED PIN COUNT INTERFACE

(76) Inventor: Peter Gillingham, Kanata (CA)

( * ) Notice: Subject to any disclaimer, the term of this patent is extended or adjusted under 35 U.S.C. 154(b) by 519 days.

(21) Appl. No.: 11/843,024

(22) Filed: Aug. 22, 2007

(65) Prior Publication Data

US 2008/0201496 A1    Aug. 21, 2008

(51) Int. Cl.
*G06F 12/00* (2006.01)
(52) U.S. Cl. ......... 711/154; 711/149; 711/169; 711/170
(58) Field of Classification Search .................. 711/167, 711/149, 154, 170; 365/233.14
See application file for complete search history.

(56) References Cited

U.S. PATENT DOCUMENTS

| | | | |
|---|---|---|---|
| 4,174,536 A | 11/1979 | Misunas et al. | |
| 4,617,566 A | 10/1986 | Diamond | |
| 4,796,231 A | 1/1989 | Pinkham | |
| 4,899,316 A | 2/1990 | Nagami | |
| 5,132,635 A | 7/1992 | Kennedy | |
| 5,204,669 A | 4/1993 | Dorfe et al. | |
| 5,229,657 A * | 7/1993 | Rackley | 326/26 |
| 5,243,703 A | 9/1993 | Farmwald et al. | |
| 5,319,598 A | 6/1994 | Aralis et al. | |
| 5,404,460 A | 4/1995 | Thomsen et al. | |
| 5,430,859 A | 7/1995 | Norman et al. | |
| 5,452,259 A | 9/1995 | McLaury | |
| 5,475,854 A | 12/1995 | Thomsen et al. | |
| 5,602,780 A | 2/1997 | Diem et al. | |
| 5,671,178 A | 9/1997 | Park et al. | |
| 5,740,379 A | 4/1998 | Hartwig | |
| 5,778,419 A | 7/1998 | Hansen et al. | |
| 5,802,399 A | 9/1998 | Yumoto et al. | |
| 5,828,899 A | 10/1998 | Richard et al. | |
| 5,859,809 A | 1/1999 | Kim | |
| 5,941,974 A | 8/1999 | Babin | |
| 6,002,638 A | 12/1999 | John | |
| 6,091,660 A | 7/2000 | Sasaki et al. | |
| 6,144,576 A | 11/2000 | Leddige et al. | |
| 6,148,364 A | 11/2000 | Srinivasan et al. | |
| 6,304,921 B1 | 10/2001 | Rooke | |
| 6,317,350 B1 | 11/2001 | Pereira et al. | |
| 6,317,352 B1 | 11/2001 | Halbert et al. | |
| 6,317,812 B1 | 11/2001 | Lofgren et al. | |
| 6,594,183 B1 | 7/2003 | Lofgren et al. | |
| 6,658,509 B1 | 12/2003 | Bonella et al. | |
| 6,680,904 B1 | 1/2004 | Kaplan et al. | |

(Continued)

FOREIGN PATENT DOCUMENTS

WO    01/69411 A2    9/2001

(Continued)

OTHER PUBLICATIONS

International Search Report mailed Jun. 4, 2008 and issued in connection with corresponding International Application No. PCT/CA2007/001789.

(Continued)

*Primary Examiner* — Yong Choe
(74) *Attorney, Agent, or Firm* — Ridout & Maybee LLP

(57) ABSTRACT

An arrangement of memory devices and a controller is based on an interface with a reduced pin count relative to a known memory device and controller arrangement. Facilitating the reduced pin count interface are some operations performed by the controller. The controller determines a width for a Data bus while assigning a target device address to each of the memory devices.

16 Claims, 12 Drawing Sheets

U.S. PATENT DOCUMENTS

| | | | |
|---|---|---|---|
| 6,715,044 | B2 | 3/2004 | Lofgren et al. |
| 6,763,426 | B1 | 7/2004 | James et al. |
| 6,816,933 | B1 | 11/2004 | Andreas |
| 6,850,443 | B2 | 2/2005 | Lofgren et al. |
| 6,853,557 | B1 | 2/2005 | Haba et al. |
| 6,853,573 | B2 | 2/2005 | Kim et al. |
| 6,928,501 | B2 | 8/2005 | Andreas et al. |
| 6,944,697 | B2 | 9/2005 | Andreas |
| 6,950,325 | B1 | 9/2005 | Chen |
| 6,996,644 | B2 | 2/2006 | Schoch et al. |
| 7,024,501 | B1* | 4/2006 | Wright ............................ 710/72 |
| 7,031,221 | B2 | 4/2006 | Mooney et al. |
| 7,032,039 | B2 | 4/2006 | DeCaro |
| 7,093,076 | B2 | 8/2006 | Kyung |
| 7,130,958 | B2 | 10/2006 | Chou et al. |
| 7,177,170 | B2 | 2/2007 | Gomm |
| 7,180,778 | B2 | 2/2007 | Kawai et al. |
| 2002/0188781 | A1 | 12/2002 | Schoch et al. |
| 2004/0001380 | A1 | 1/2004 | Becca et al. |
| 2004/0024960 | A1 | 2/2004 | King et al. |
| 2004/0148482 | A1 | 7/2004 | Grundy et al. |
| 2005/0078535 | A1* | 4/2005 | Choi et al. .................... 365/202 |
| 2005/0081012 | A1* | 4/2005 | Gillingham et al. .......... 711/167 |
| 2005/0166006 | A1 | 7/2005 | Talbot et al. |
| 2006/0031593 | A1 | 2/2006 | Sinclair |
| 2006/0067156 | A1* | 3/2006 | Ruckerbauer et al. ........ 365/233 |
| 2006/0248305 | A1 | 11/2006 | Fang et al. |
| 2007/0038852 | A1 | 2/2007 | Bovino et al. |
| 2007/0064629 | A1 | 3/2007 | Regev et al. |
| 2007/0076479 | A1 | 4/2007 | Kim et al. |
| 2007/0076502 | A1 | 4/2007 | Pyeon et al. |
| 2007/0109833 | A1 | 5/2007 | Pyeon et al. |
| 2007/0153576 | A1 | 7/2007 | Oh et al. |
| 2007/0157000 | A1 | 7/2007 | Qawami et al. |
| 2007/0233903 | A1 | 10/2007 | Pyeon |
| 2007/0234071 | A1 | 10/2007 | Pyeon |
| 2008/0016269 | A1 | 1/2008 | Chow et al. |
| 2008/0019189 | A1 | 1/2008 | Lin |
| 2008/0019196 | A1 | 1/2008 | Lin |

FOREIGN PATENT DOCUMENTS

| | | |
|---|---|---|
| WO | 2006036811 A2 | 4/2006 |

OTHER PUBLICATIONS

Takeuchi, K. et al, A 56nm CMOS 99mm2 8Gb Multi-level NAND Flash Memory with 10MB/s Program Throughput, Solid-State Circuits, 2006 IEEE International Conference Digest of Technical Papers, Session 7, Feb. 6-9, 2006, pp. 507-516, ISBN: 1-4244-0079-1.

Samsung Electronics Co. LTD, 256M×8 Bit/ 128 M×16 Bit/ 512M×8 Bit NAND Flash Memory, K9K4G08U1M, May 6, 2005, pp. 1-41.

Toshiba, 2GBIT (256M×8 Bits) CMOS NAND E2PROM, TH58NVG1S3AFT05, May 19, 2003, pp. 1-32.

Atmel Corp., High Speed Small Sectored SPI Flash Memory, pp. 1-23, 2006.

Spansion, 64 Megabit CMOS 3.0 Volt Flash Memory with 50MHz SPI (Serial Peripheral Interface) Bus, , pp. 1-32, Sep. 6, 2006.

King et al, Communicating with Daisy Chained MCP42XXX Digital Potentiometers, Microchip AN747, pp. 1-8, 2001.

Intel Corporation, Intel® Advanced+Boot Block Flash Memory (C3), May 2005, pp. 1-72.

M-Systems Flash Disk Pioneers Ltd., DiskOnChip H1 4Gb (512MByte) and 8Gb (1 GByte) High Capacity Flash Disk with NAND and x2 Technology, Data Sheet, Rev. 0.5 (Preliminary), pp. 1-66, 2005.

Samsung Electronics Co. Ltd, OneNAND4G(KFW4G16Q2M-DEB6), OneNAND2G (KFH2G16Q2M-DEB6), OneNAND1G(KFG1G16Q2M-DEB6) Flash Memory, OneNAND™ Specification Ver. 1.2, pp. 1-125, Dec. 23, 2005.

Kennedy, J., et al., A 2Gb/s Point-to-Point Heterogeneous Voltage Capable DRAM Interface for Capacity-Scalable Memory Subsystems, ISSCC 2004/Session 11/DRAM/11.8, IEEE International Solid-State Circuits Conference, Feb. 15-19, 2004, vol. 1, pp. 214-523.

Samsung Electronics, DDR2 Fully Buffered DIMM 240pin FBDIMMS based on 512Mb C-die Rev. 1.3, Sep. 2006, pp. 1-32, Sep. 2006.

Hypertransport TM I/O Link Specification, Revision 3.00, Document No. HTC20051222-0046-0008, HyperTransport Technology Consortium, pp. 1-428, Apr. 21, 2006.

Samsung Electronics, K9XXG08UXM Preliminary Flash Memory, Technical Specification, Samsung Electronics, 43 pages.

Stein Gjessing, David B. Gustavson, David V James, Glen Stone & Hans Wiggers; A Ram Link for High Speed; IEEE Spectrum; vol. 29, No. 10; Oct. 1992; pp. 52-53; 0018-9235/92/.

Stein Gjessing & Glen Stone; Performance of the RamLink Memory Architecture; Proceedings of the Twenty-Seventh Annual Hawaii International Conference on System Sciences, 1994; pp. 154-162; 1060-3425/94.

Stein Gjessing, Glen Stone & Hans Wiggers; RamLink: A High-Bandwidth Point-To-Point Memory Architecture; IEEE Spectrum; 1992; pp. 328-331; 0-8186-2655-0/92/.

Stephen L. Diamond, Synclink:High Speed DRAM for the Future; IEEE Micro, Dec. 1996; pp. 74-75.

The Institute of Electrical and Electronics Engineers, Inc.; IEEE Standard for High-Bandwidth Memory Interface Based on Scalable Coherent Interface (SCI) Signaling Technology (RamLink); IEEE Std 1596.4-1996; Mar. 19, 1996; pp. 1-98; ISBN 1-55937-745-3.

Yoichi Oshima; Bing Sheu & Steve H. Jens; High-Speed Memory Architectures for Multimedia Applications; Circuits & Devices; IEEE; Jan. 1997; 8755-3996/97.

* cited by examiner

| Operation | Command (2 Bytes) | | Row Address (3 Bytes) | Column Address (2 Bytes) | Input Data (1 to 2112 Bytes) |
|---|---|---|---|---|---|
| | Device Address (1 Byte) | Operation Code (1 Byte) | | | |
| Page Read | Valid | 0Xh | Valid | - | - |
| Page Read for Copy | Valid | 1Xh | Valid | - | - |
| Burst Data Read | Valid | 2Xh | - | Valid | - |
| Burst Data Load Start | Valid | 4Xh | - | Valid | Valid |
| Burst Data Load | Valid | 5Xh | - | Valid | Valid |
| Page Program | Valid | 6Xh | Valid | - | - |
| Partial Block Erase Address Input | Valid | 7Xh | Valid | - | - |
| Block Erase Address Input | Valid | 8Xh | Valid | - | - |
| Page-pair Erase Address Input | Valid | 9Xh | Valid | - | - |
| Erase | Valid | AXh | - | - | - |
| Operation Abort | Valid | CXh | - | - | - |
| Read Status Register | Valid | F0h | - | - | - |
| Read Device Information Register | Valid | F4h | - | - | - |
| Read Link Configuration Register | Valid | F7h | - | - | - |
| Write Link Configuration Register | FFh | FFh | - | - | Valid (1 Byte only) |

FIG. 5

REDUCED PIN COUNT INTERFACE

FIELD

The present application relates generally to a controller and a set of controlled memory devices and, more specifically, to adapting the controller and the memory devices to a reduced pin count interface between the controller and the memory devices as well as between the memory devices.

BACKGROUND

In a typical electronic memory arrangement, reading from and writing to several memory devices is organized by a controller. Double-data-rate synchronous dynamic random access memory (DDR SDRAM) is an example of such an arrangement. For a write operation, the controller places data on a data bus while indicating, on a command bus, a write command, and indicating, on an address bus, a location on the particular memory device at which the data is to be stored. For a read operation, the controller indicates, on the command bus, a read command, and indicates, on an address bus, a location on the particular memory device from which the data is to be read. The memory device responds to the read command and address by placing the requested read data on the data bus.

In contrast, in an alternative electronic memory arrangement, memory devices are arranged in a ring or loop. Rather than a data bus, there is a data connection between a controller and a first memory device in the ring. The data connection may, for example, be a multibit bus. A data signal received at the first memory device on the data connection is passed on to a second memory device on an other data connection and a data signal received at the second memory device on the other data connection is passed on to a third memory device on a further data connection, etc. Thus, the data signal propagates around the ring until the data signal is returned to the controller. In addition to the data signal propagating through the ring, there are additional signals also propagating through the ring: a Command Strobe signal; and a Data Strobe signal.

For a write operation, the controller causes the Command Strobe signal to transition from "0" to "1" to indicate the start of a packet. Simultaneously, the controller starts to transmit, on the data connection, a write packet that includes: a write command indicating a particular memory device and address to which data is to be written followed by the data that is to be written. The controller then causes the Command Strobe signal to transition from "1" to "0" to indicate the end of the write packet.

For a read operation, the controller causes the Command Strobe signal to transition from "0" to "1" to indicate the start of a packet. Simultaneously, the controller starts to transmit, on the data connection, a read data packet that includes: a read command indicating a particular memory device and address from which the data is to be read. The controller then causes the Command Strobe signal to transition from "1" to "0" to indicate the end of the read command packet. Subsequently, the controller causes the Data Strobe signal to transition from "0" to "1" to indicate, to the particular memory device, that the requested read data is be transmitted on the data connection.

In the ring arrangement, a read command primes a memory device for a read data transfer. The length of a read is arbitrary and interruptible since the end of the read data transfer operation is determined by a transition of the Data Strobe signal from "1" to "0". Similarly, the length of a write is arbitrary and interruptible since the end of the write data transfer operation is determined by a transition of the Command Strobe signal from "1" to "0".

As discussed, when memory devices are arranged in a ring, packets originate at a controller and flow unidirectionally through a ring of memory devices and back to the controller. Different configurations are possible based on either distributing a clock in parallel or sourcing the clock synchronously along with the data and strobes. The second configuration has more pin overhead than the first configuration based on extra differential clock output pins.

Pin overhead continues to be a carefully monitored quality of interfaces between devices, such as the interface between the controller and the first memory device or between memory devices, with a lower pin overhead being desirable. That is, it is desirable to reduce the ratio of control pins to data pins.

BRIEF DESCRIPTION OF THE DRAWINGS

Reference will now be made to the drawings, which show by way of example, embodiments of the invention, and in which:

FIG. 5 illustrates, in table format, an example command set for the arrangement of FIG. 1;

DETAILED DESCRIPTION OF THE EMBODIMENTS

Figure 1:
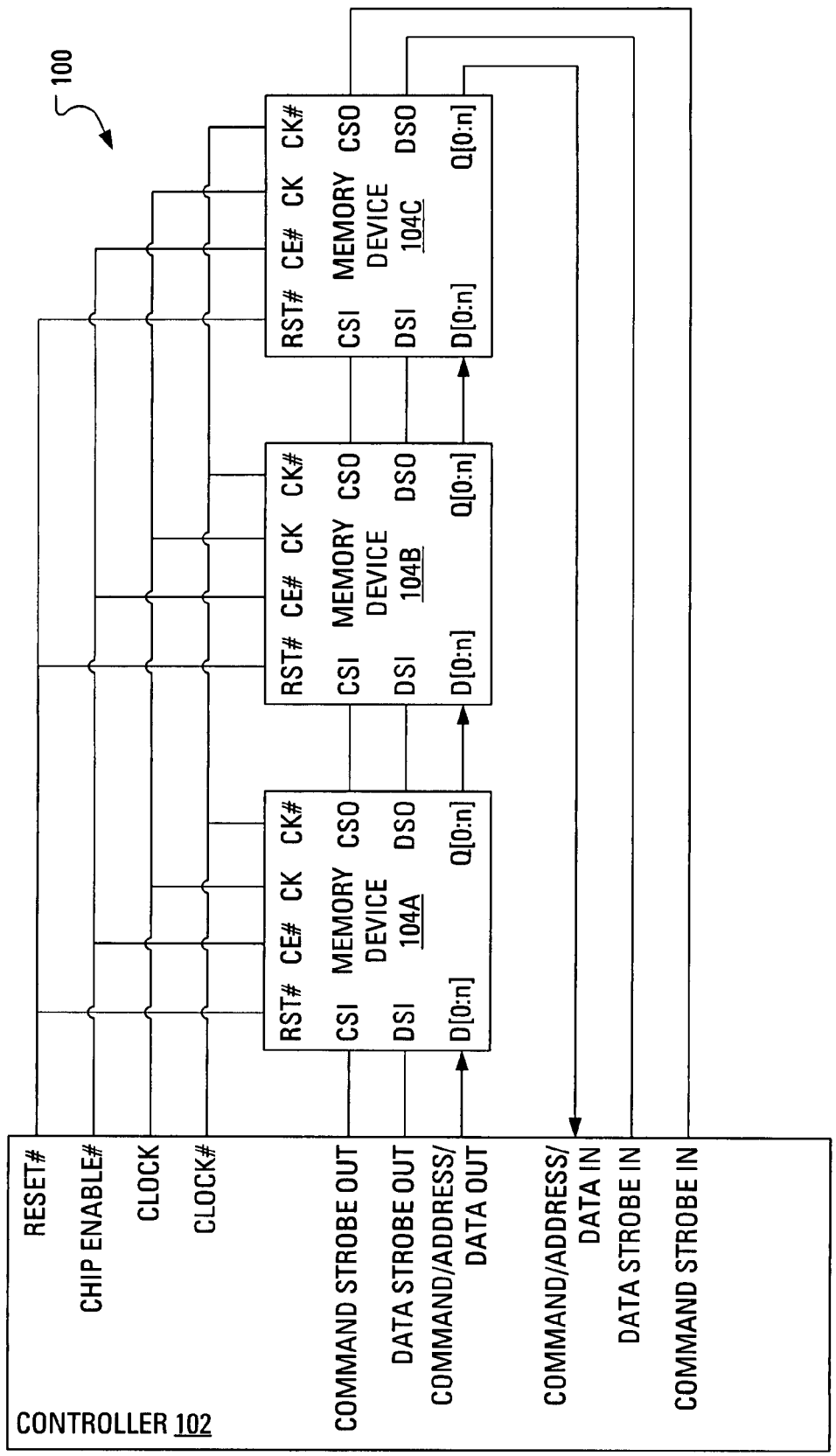
FIG. 1 illustrates a ring arrangement of memory devices configured for parallel clock distribution.

A memory controller may dispense with the requirement for strobe signals in ring-based memory arrangements by configuring the memory devices with an efficiently designed configuration command. The configuration command allows the controller to assign to each memory a device target device address and determine the data width of the ring.

In accordance with an example embodiment, there is provided, at a controller, a method of configuring a plurality of memory devices arranged in a ring such that output from a given memory device is received as input by a subsequent memory device around the ring, wherein a first memory device in the ring receives output from the controller as input and a last memory device provides output as input to the controller. The method includes, in a first clock cycle, transmitting, on each controller output bit of a plurality of controller output bits in a multibit data connection to the first memory device, a recognizable signal. The method also includes transmitting, in a number, M, of subsequent clock cycles and on subsets of controller output bits of the plurality of controller output bits in the multibit data connection, the recognizable signal, such that M+1 is equivalent to a ratio of a maximum configurable number of output bits in the multibit data connection to a minimum number of configurable output bits, the subsets of controller output bits including at least a first controller output bit. The method then includes, in each clock cycle of a further number, N, of subsequent clock cycles, transmitting, on the first controller output bit, a single-bit portion of an address a given memory device among the plurality of memory devices, such that N is equivalent to the number of bits used to address the each memory device. In other example embodiments, a memory device controller is provided for carrying out this method, a memory system is provided that includes a memory device controller for carrying out this method and a computer readable medium is provided for adapting a memory device controller to carry out this method.

In accordance with another example embodiment, there is provided, a method of configuring a plurality of memory devices arranged in a ring. The method includes initializing an operand, transmitting, on one or a plurality of controller output pins in a data connection to a first memory device of the plurality of memory devices, a command including the operand and determining that the command has not propagated around the ring and been received. The method also includes incrementing the operand, thereby creating an updated operand, transmitting, on the one or plurality of controller output pins, a further command including the updated operand and repeating the incrementing and transmitting the further command. The method also includes determining that a portion of the further command has been received on an active subset of controller input pins of a plurality of controller input pins, responsive to the determining that the portion has propagated around the ring and has been received, interrupting the repeating and transmitting packets on an active subset of controller output pins corresponding to the active subset of controller input pins. In other example embodiments, a memory device controller is provided for carrying out this method, a memory system is provided that includes a memory device controller for carrying out this method and a computer readable medium is provided for adapting a memory device controller to carry out this method.

Conveniently, aspects of the present application provide a memory, controller, or memory subsystem (either multidrop bus or ring topology) where the operational data width is configured by transmitting a pattern on the data bus. Additionally, there is provided a memory, controller, or memory subsystem in a ring topology where device addresses are assigned sequentially by the controller. Furthermore, there is provided a memory, controller, or memory subsystem in a ring topology where device addresses are assigned by the controller in a format that can be properly recognized by devices operating in multiple data widths. Still further, there is provided a memory, controller, or memory subsystem (either multidrop bus or ring topology) where devices recognize the start of a command by a known pattern different from a background idle pattern.

In an arrangement 100 illustrated in FIG. 1, a first memory device 104A, a second memory device 104B and a third memory device 104C (collectively or individually 104) are in a ring or loop arrangement. Operation of the memory devices 104 for writing or reading is organized by a controller 102.

The controller 102 is connected to the first memory device 104A by way of a Command Strobe Line, a Data Strobe Line and a Data bus. Similarly, the first memory device 104A is connected to the second memory device 104B by way of a Command Strobe Line, a Data Strobe Line and a Data bus. It follows that the second memory device 104B is connected to the third memory device 104C by way of a Command Strobe Line, a Data Strobe Line and a Data bus. Finally, the third memory device 104C is connected to the controller 102 by way of a Command Strobe Line, a Data Strobe Line and a Data bus. The controller 102 is also connected to each of the memory devices 104, in parallel, by a Reset line, a Chip Enable line, a Clock line and an inverse Clock line.

Figure 2:
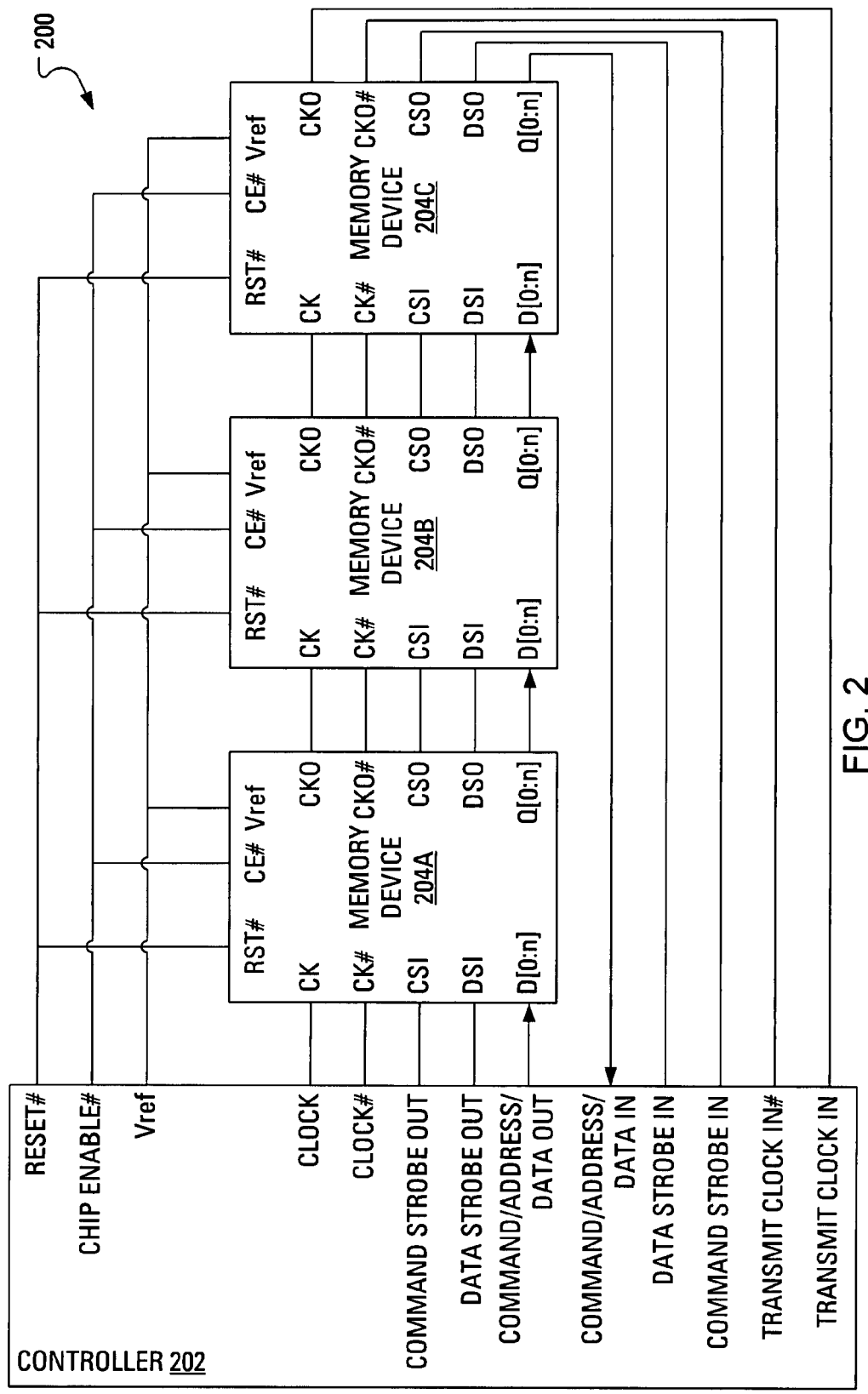
FIG. 2 illustrates a ring arrangement of memory devices configured for source synchronous clock distribution.

An arrangement 200 of memory devices illustrated in FIG. 2 differs from the arrangement 100 of FIG. 1 in that the clock signal (and the inverse of the clock signal) is distributed source synchronously with the strobes and data bus in the arrangement 200 of FIG. 2, whereas the clock signal (and the inverse of the clock signal) is distributed in a parallel manner in the arrangement 100 of FIG. 1.

In the arrangement 200 of FIG. 2, a controller 202 is connected to a first memory device 204A by way of a Command Strobe Line, a Data Strobe Line, a Data bus, a Clock line and an inverse Clock line. Similarly, the first memory device 204A is connected to a second memory device 204B by way of a Command Strobe Line, a Data Strobe Line, a Data bus, a Clock line and an inverse Clock line. It follows that the second memory device 204B is connected to a third memory device 204C by way of a Command Strobe Line, a Data Strobe Line, a Data bus, a Clock line and an inverse Clock line. Finally, the third memory device 204C is connected to the controller 202 by way of a Command Strobe Line, a Data Strobe Line, a Data bus, a Clock line and an inverse Clock line. The controller 202 is also connected to each of the memory devices 204, in parallel, by a Reset line, a Chip Enable line and a reference voltage line.

Figure 3:
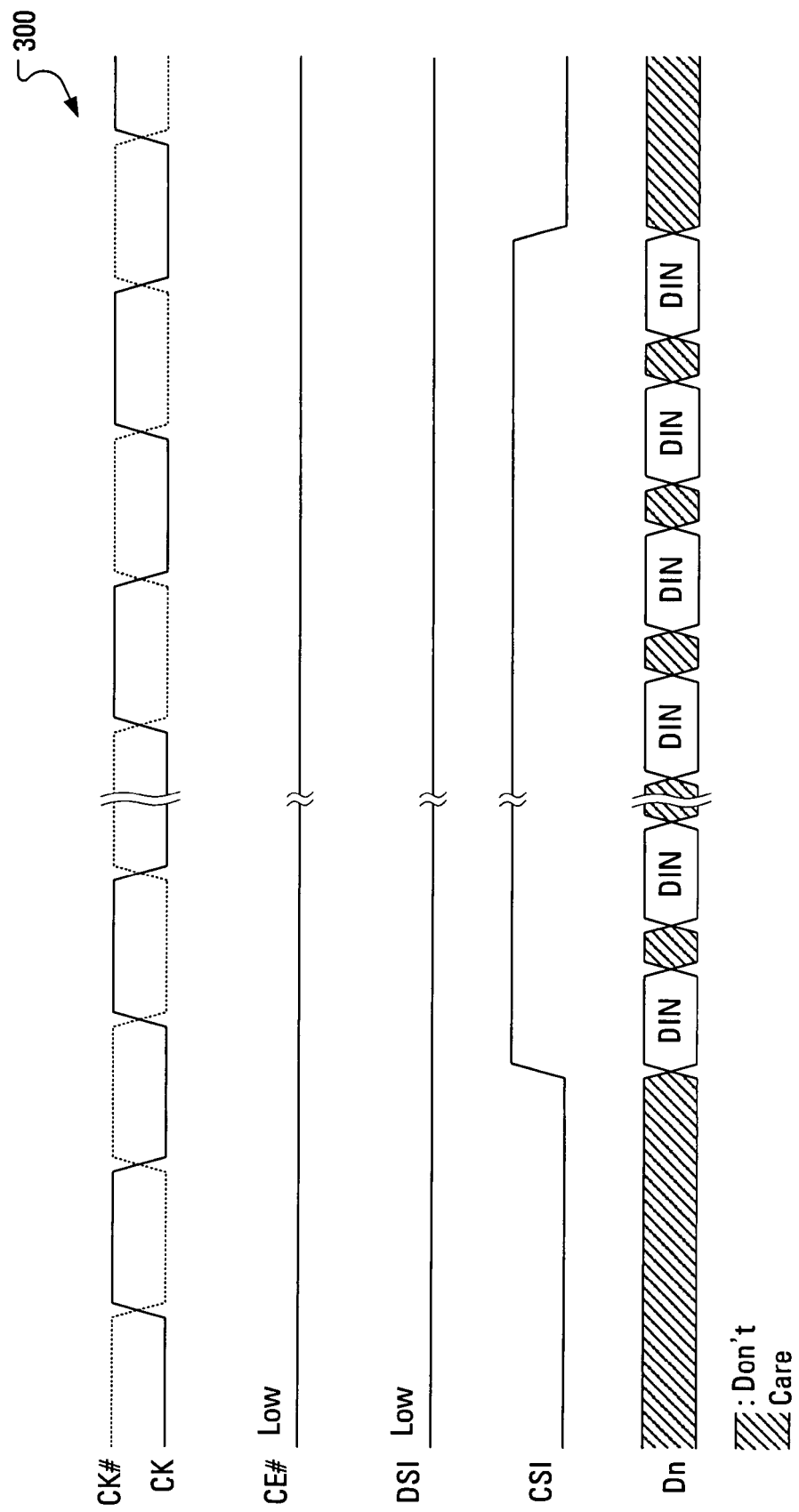
FIG. 3 illustrates a timing diagram for command and write data packet timing for the arrangement of FIG. 1.

In a timing diagram 300 in FIG. 3, command and write data packet timing is illustrated for the arrangement 100 of FIG. 1. Inputs to the memory device 104 on the (possibly multibit) Data bus may be representative of a command, representative of data, representative of a target device address, or representative of an address within the memory device. Inputs on the Data bus may be captured (shifted in to registers) on the crossing of the signal on the Clock line (CK) with the signal on the inverse Clock line (CK#) when the signal on the Chip Enable (CE#) line is at a logical LOW and the signal on the Command Strobe line (received at the CSI pin) is at a logical HIGH.

Figure 4:
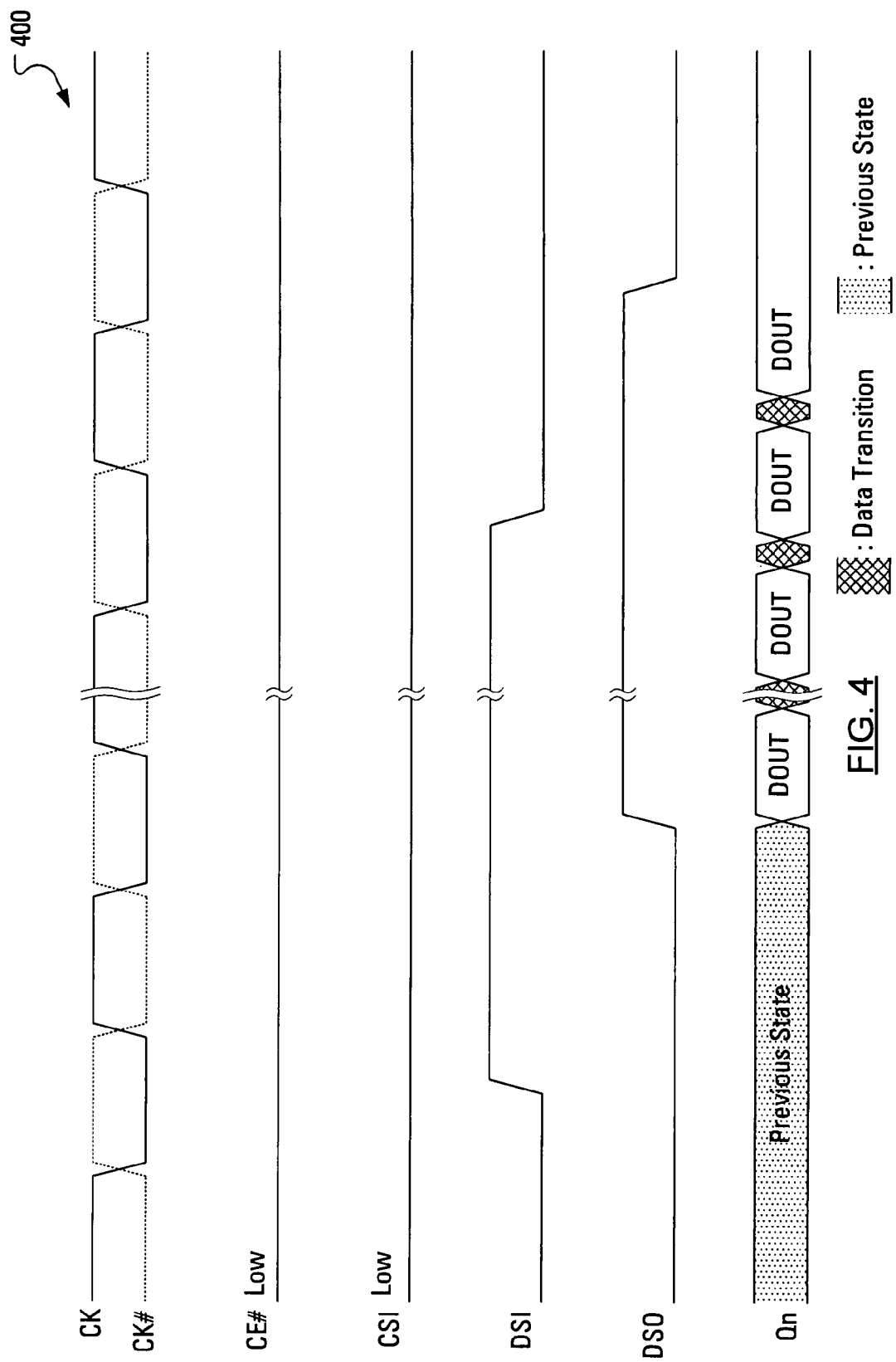
FIG. 4 illustrates a timing diagram for read data packet timing for the arrangement of FIG. 1.

In a timing diagram 400 in FIG. 4, read data packet timing is illustrated for the arrangement 100 of FIG. 1. Output on the Data bus may be synchronously shifted out at the crossing of the signal on the Clock line (CK) with the signal on the inverse Clock line (CK#) when the signal on the Chip Enable (CE#) line is at a logical LOW and the signal on the Data Strobe line (received at the DSI pin) is at a logical HIGH. There is a fixed latency in the memory from the time the logical HIGH on the DSI pin is received and when a logical HIGH on the DSO pin and the accompanying read data are output.

An example command set for the memory device arrangement 100 of FIG. 1 is illustrated, in table format, in FIG. 5. The example command set may also be seen as Table 3 in U.S. Provisional Patent Application Ser. No. 60/902,003, filed Feb. 16, 2007, the contents of which are hereby incorporated herein by reference. Notably, in the Operation Code column, X=0h when the operation is to be performed on memory bank 0 and X=1h when the operation is to be performed on memory bank 1, etc. Furthermore, the "Write Link Configuration Register" command has a Device Address of FFh because the command is a "broadcasting only" command.

Figure 6:
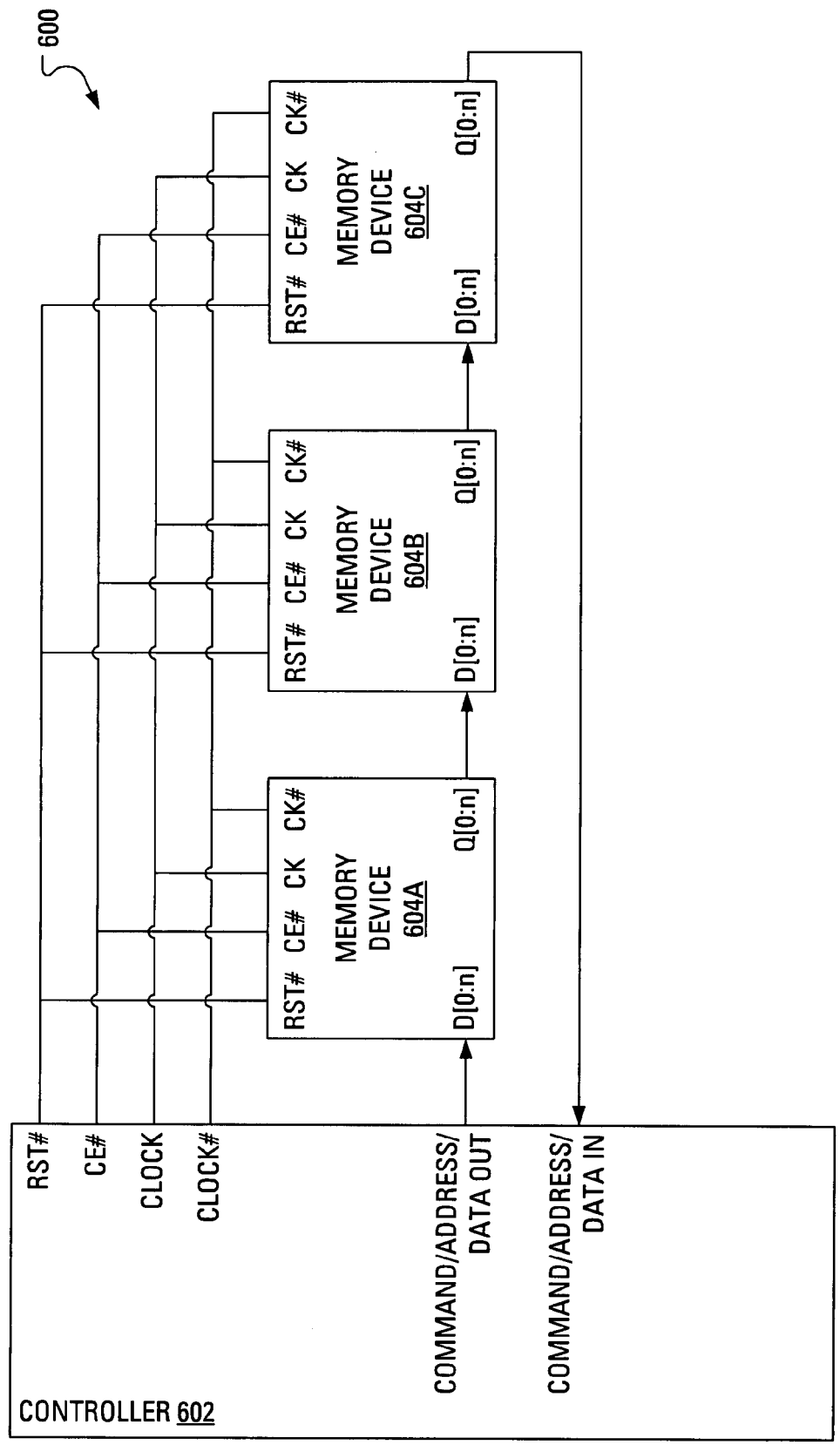
FIG. 6 illustrates a novel arrangement of memory devices configured for parallel clock distribution.

In a novel arrangement 600 illustrated in FIG. 6, a first memory device 604A, a second memory device 604B and a third memory device 604C (collectively or individually 604) are in a ring or loop arrangement. Operation of the memory devices 604 for writing or reading is organized by a controller 602.

The controller 602 is connected to the first memory device 604A by way of a unidirectional, point-to-point Data bus. Similarly, the first memory device 604A is connected to the second memory device 604B by way of a unidirectional, point-to-point Data bus. It follows that the second memory device 604B is connected to the third memory device 604C by way of a unidirectional, point-to-point Data bus. Finally, the third memory device 604C is connected to the controller 602 by way of a unidirectional, point-to-point Data bus. The controller 602 is also connected to each of the memory devices 604, in parallel, by a Reset line, a Chip Enable line, a Clock line and an inverse Clock line.

Figure 10:
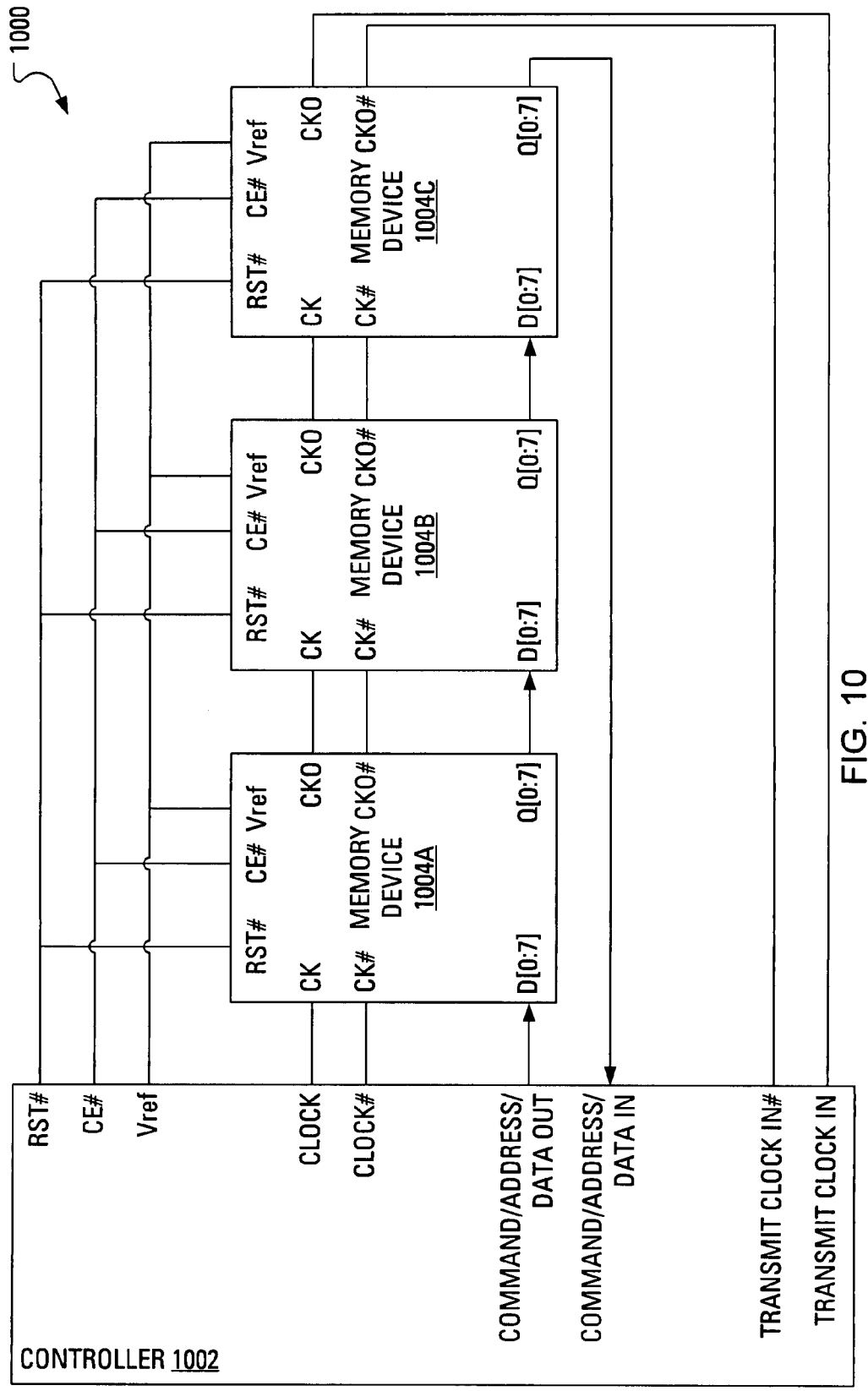
FIG. 10 illustrates a novel arrangement of memory devices configured for synchronous clock distribution.

A novel arrangement 1000 of memory devices illustrated in FIG. 10 differs from the novel arrangement 600 of FIG. 6 in that the clock signal (and the inverse of the clock signal) is distributed source-synchronously with the Data bus in the arrangement 1000 of FIG. 10, whereas the clock signal (and the inverse of the clock signal) is distributed in a parallel manner in the arrangement 600 of FIG. 6.

In the arrangement 1000 of FIG. 10, a controller 1002 is connected to a first memory device 1004A by way of a unidirectional, point-to-point Data bus, a Clock line and an inverse Clock line. Similarly, the first memory device 1004A is connected to a second memory device 1004B by way of a unidirectional, point-to-point Data bus, a Clock line and an inverse Clock line. It follows that the second memory device 1004B is connected to a third memory device 1004C by way of a unidirectional, point-to-point Data bus, a Clock line and an inverse Clock line. Finally, the third memory device 1004C is connected to the controller 1002 by way of a unidirectional, point-to-point Data bus, a Clock line and an inverse Clock line. The controller 1002 is also connected to each of the memory devices 1004, in parallel, by a Reset line, a Chip Enable line and a reference voltage line.

In overview, the memory device arrangement 600 of FIG. 6 provides an alternative to the memory device arrangement 100 of FIG. 1. In particular, the memory device arrangement 600 of FIG. 6 provides a reduced pin count interface between the controller 602 and the first memory device 604A and between successive memory devices 604. Facilitating the reduced pin count interface are some operations performed by the controller 602. The controller 602 determines a desired width for the Data bus while assigning a target device address to each of the memory devices 604. Similarly, the memory device arrangement 1000 of FIG. 10 provides an alternative to the memory device arrangement 200 of FIG. 2. In particular, the memory device arrangement 1000 of FIG. 10 provides a reduced pin count interface between the controller 1002 and the first memory device 1004A and between successive memory devices 1004. Indeed, while the following is described in relation to the arrangement 600 of FIG. 6, it should be appreciated that the discussion applies equally to the arrangement 1000 of FIG. 10.

Upon power on or after reset, each of the memory devices 604 of FIG. 6 assume default characteristics. In particular, upon power on or after reset each memory device has all ones in a device address register. That is, if the device address register (not shown) is a seven-bit address register, upon power on or after reset, the address register holds an address of "1111111". Additionally, all pins Q[0:n] that shift data to the Data bus are arranged to output logical low, i.e., "0". Also upon power on or after reset, the controller 602 transmits idle commands, consisting of continuous "0"s, to the input pins D[0:n] of the first memory device 604A.

To facilitate operation without strobe signals, all packets emanating from the controller 602 have a length that can be determined by decoding the command portion of the packet.

Figure 7:
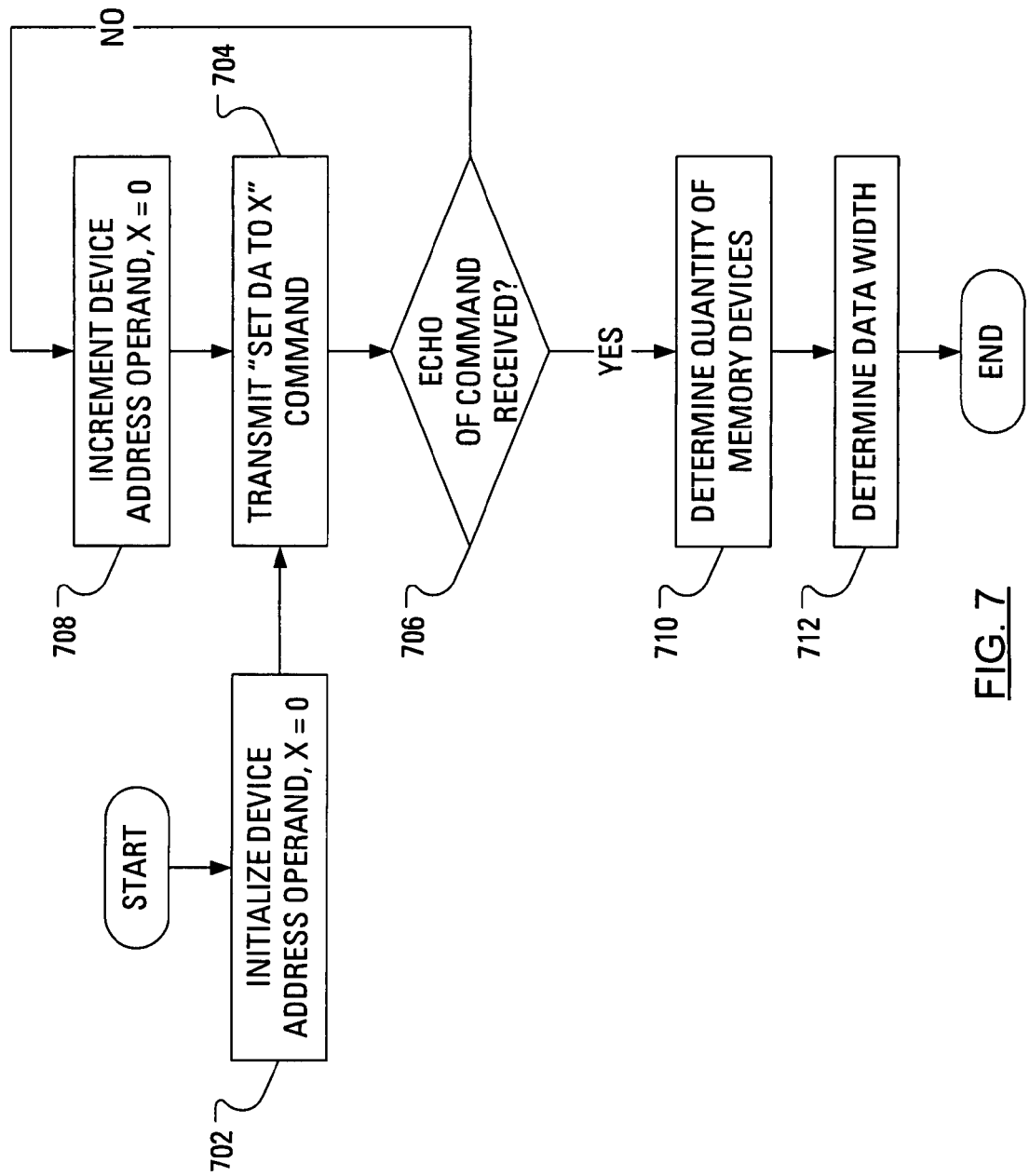
FIG. 7 illustrates steps in an example method of configuring each of the memory devices with a distinct target device address according to example embodiments.

After reset, the controller 602 executes a configuration method, example steps of which are presented in FIG. 7.

Figure 8:
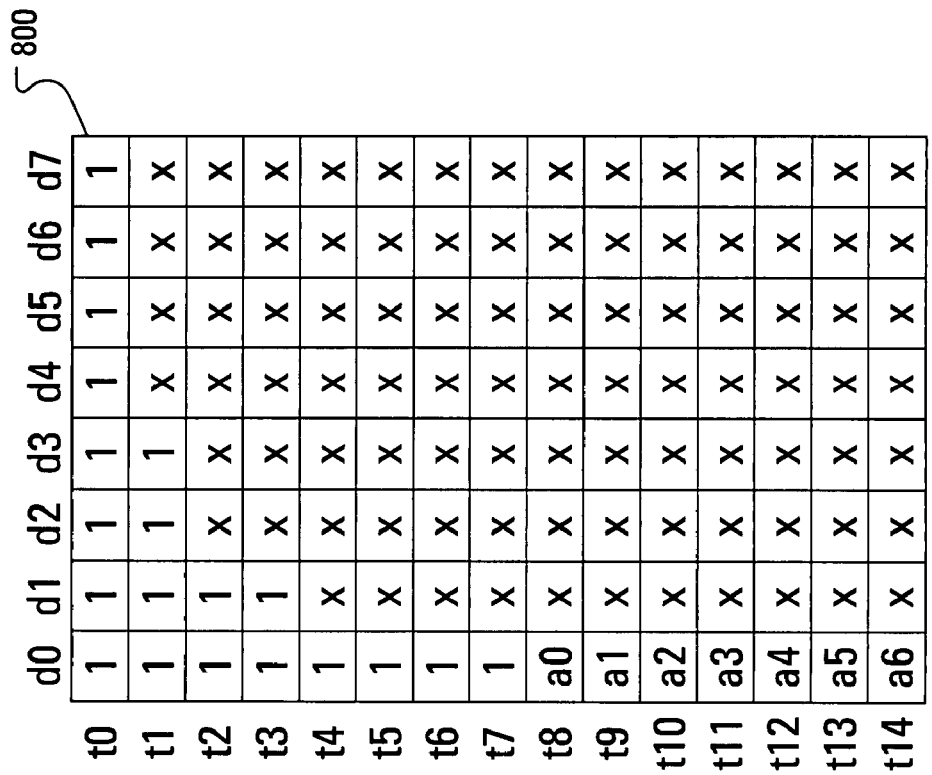
FIG. 8 illustrates an example configuration command according to example embodiments.

The controller 602 begins by initializing (step 702) a target device address operand, X=[a0, a1, a2, a3, a4, a5, a6], to zero, e.g., X=[0, 0, 0, 0, 0, 0, 0]. The controller 602 then transmits (step 704) a "Set TDA to X" command. An example "Set TDA to X" command 800 is illustrated in FIG. 8. The "Set TDA to X" command 800 primarily has two components. The first component may be considered as a device address or as an operational code (opcode). The second component is the operand, X. The example "Set TDA to X" 800 command extends for 16 clock cycles (t0-t14) and is arranged to be suitable for setting the TDA in rings of a variety of data widths.

For the first component to be considered to be a device address, each of the memory devices 604 should have their respective seven-bit (for this example) TDA registers filled with "1"s after power on or reset. For the first component to be considered an op code, each of the memory devices 604 should recognize eight received "1" bits as representative of the only command the memory device 604 is prepared to execute while in the reset state. Furthermore, for operation without strobes, all commands starts with a known pattern, in this case, "1" in bit position d0, to distinguish a command from the idle background of "0".

In the situation wherein a ring of memory devices has an eight-bit data width (i.e., x8), the eight bits received in the first clock cycle, t0, by a memory device in the reset state may be recognized as the beginning of a "Set TDA to X" command. The memory device may then ignore the data received in clock cycles t1-t7. The memory device may then overwrite its TDA register with the value received on the first bit (d0) of the data bus for the clock cycles t8-t14.

In the situation wherein a ring of memory devices has a four-bit data width (i.e., x4), the four bits received in the first clock cycle, t0, on the first four bits (d0, d1, d2, d3) of the data bus along with the four bits received in the second clock cycle, t1, on the first four bits of the data bus by a memory device in the reset state may be recognized as the beginning of a "Set TDA to X" command. The memory device may then ignore the data received in clock cycles t2-t7. The memory device may then overwrite its TDA register with the value received on the first bit (d0) of the data bus for the clock cycles t8-t14.

In the situation wherein a ring of memory devices has a two-bit data width (i.e., x2), the two bits received in the first clock cycle, t0, on the first two bits (d0, d1) of the data bus along with the two bits received in the second clock cycle, t1, on the first two bits of the data bus, the two bits received in the third clock cycle, t2, on the first two bits of the data bus, and the two bits received in the fourth clock cycle, t3, on the first two bits of the data bus by a memory device in the reset state may be recognized as the beginning of a "Set TDA to X" command. The memory device may then ignore the data received in clock cycles t4-t7. The memory device may then overwrite its TDA register with the value received on the first bit of the data bus for the clock cycles t8-t14.

In the situation wherein a ring of memory devices has a one-bit data width (i.e., x1) the eight bits received in the first eight clock cycles, t0-t7, on the first bit of the data bus, by a memory device in the reset state may be recognized as the beginning of a "Set TDA to X" command. The memory device may then overwrite its TDA register with the value received on the first bit of the data bus for the clock cycles t8-t14.

In general, a number, M, of clock cycles that follow the first clock cycle, t0, is selected such that M+1 is equivalent to a ratio of a maximum configurable number of output bits in the multibit data connection to a minimum number of configurable output bits. Additionally, a further number, N, of subsequent clock cycles, such that N is equivalent to the number of bits used to address each memory device.

As will be clear to a person of ordinary skill in the art, the number of clock cycles necessary for the "Set TDA to X" command (M+N+1) is dependent upon the size of the address to be written to the TDA register in each memory device as well as the size of the opcode or address to be used to signify, to the memory devices, that the command is a "Set TDA to X" command. In this case, the address to be written is a seven-bit address and eight bits are used to signify the unique command. Accordingly, fifteen clock cycles are required to ensure that the unique command can be properly received by a ring of x1 memory devices. It follows that in the case wherein the address to be written is a three-bit address and four bits are used to signify the unique command, seven clock cycles would be required to ensure that the unique command can be properly received by a ring of x1 memory devices.

It may seem that the bits transmitted across the breadth of the data bus are extraneous, given that all necessary information is carried on the first bit (d0) of the data bus over the course of the command. However, as will be discussed below, once a TDA has been set for all memory devices, a transmitted "Set TDA to X" command traverses the entire ring and returns to the controller. The controller can then determine, in the first clock cycle, the data width of the ring from the received "1"s first bits of the data bus.

Notably, the data width of a ring of memory devices is established upon the installation of the memory devices. In an arrangement 900 illustrated in FIG. 9, a first memory device 904A, a second memory device 904B and a third memory device 904C (collectively or individually 904) are in a ring or loop arrangement. Operation of the memory devices 904 for writing or reading is organized by a controller 902.

The controller 902 is connected to the first memory device 904A by way of a Data bus. Similarly, the first memory device 904A is connected to the second memory device 904B by way of a Data bus. It follows that the second memory device 904B is connected to the third memory device 904C by way of a Data bus. Finally, the third memory device 904C is connected to the controller 902 by way of a Data bus. For ease of illustration, the Reset line, the Chip Enable line, the Clock line and the inverse Clock line are omitted.

Figure 9:
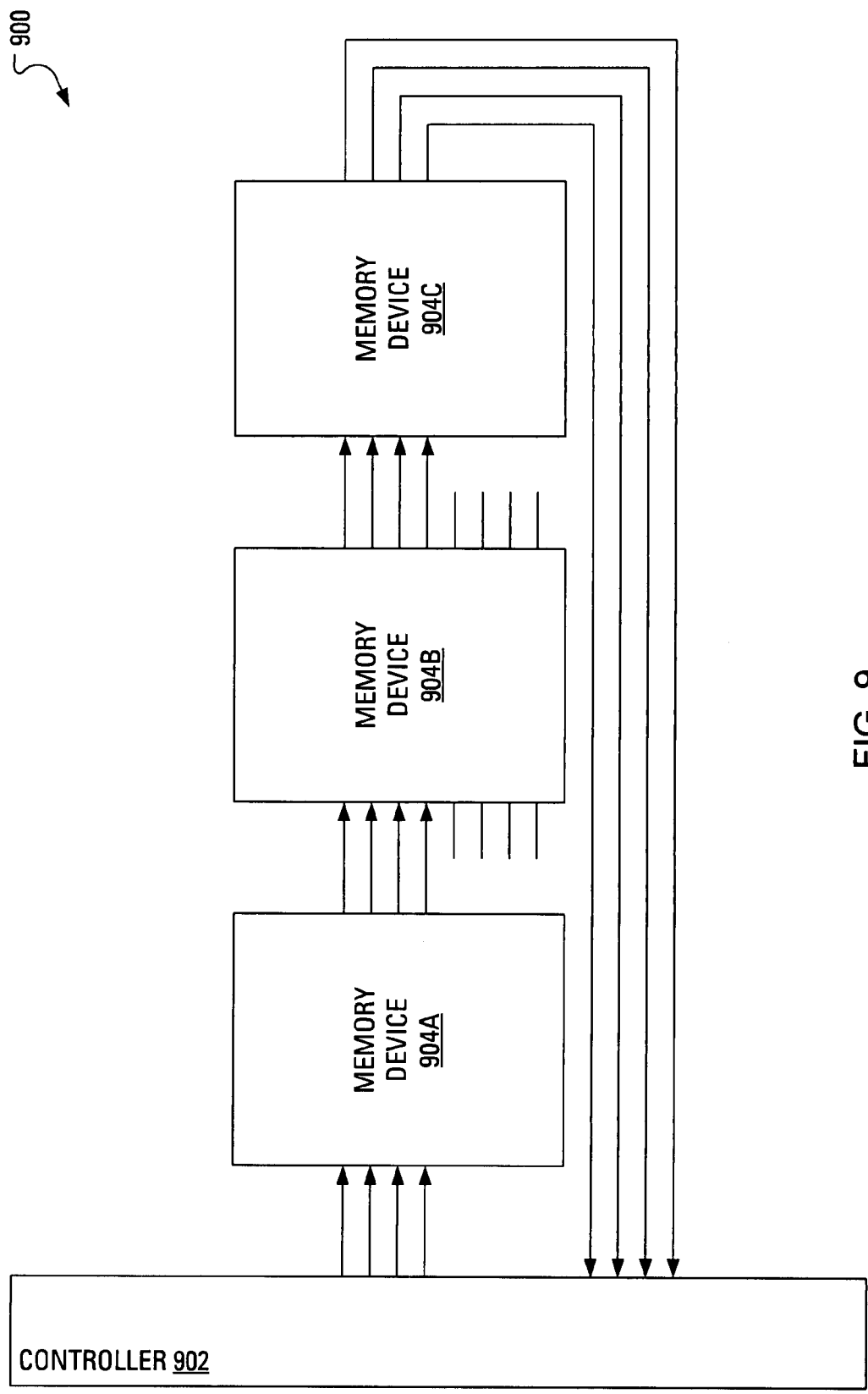
FIG. 9 illustrates a simplified arrangement of memory devices to illustrate non-uniform data widths.

Both the first memory device 904A and the third memory device 904C are 4-bit data bus devices, while the second memory 904B device is an 8-bit data bus device. In order that the data bus be a consistent width throughout the arrangement 900 of FIG. 9, four of the data bus inputs on the second memory device 904B are connected to ground during installation of the second memory device 904B in the arrangement 900 of FIG. 9. Although the width of the data bus in the arrangement 900 of FIG. 9 is established upon installation of the components, the controller 902 is not aware of the width of the data bus until completion of a configuration method, an example of which is provided in FIG. 7.

In operation, in a "recently reset" state, the only command a memory device 604 is prepared to accept is a "Set TDA to X" command. Upon receiving the "Set TDA to X" command from the controller 602, the first memory device 604A recognizes that it is prepared to accept the command and, according to the command, overwrites its internal TDA register with the value contained in the operand X, which, in this case, is "0". As the "Set TDA to X" command is a special command, the first memory device 604A does not transmit the command on the Data bus output pins Q[0:n].

Subsequently, the controller 602 determines (step 706) whether an echo of the command sent in step 704 has been received. Where an echo has not been received, the controller 602 increments the operand (step 708).

The controller 602 then transmits a "Set TDA to X" command, with operand X="1". Since the first memory device 604A is no longer in a "recently reset" state, the first memory device 604A recognizes that the command is not intended for itself. Consequently, the first memory device 604A retransmits the received command on the Data bus output pins Q[0:n]. The command is received on the Data bus input pins D[0:n] at the second memory device 604B.

Upon receiving the "Set TDA to X" command from the first memory device 604A, the second memory device 604B recognizes that it is prepared to accept the command and, according to the command, overwrites its internal TDA register with the value contained in the operand X, which, in this case, is "1". As the "Set TDA to X" command is a special command, the second memory device 604B does not transmit the command on the Data bus output pins Q[0:n].

Subsequently, the controller 602 determines (step 706) whether an echo of the command sent in step 704 has been received. Where an echo has not been received, the controller 602 increments (step 708) the operand.

The controller 602 then transmits (step 704) a "Set TDA to X" command, with operand X="2". Since the first memory device 604A is no longer in a "recently reset" state, the first memory device 604A recognizes that the command is not intended for itself. Consequently, the first memory device 604A retransmits the received command on the Data bus output pins Q[0:n]. The command is received on the Data bus input pins D[0:n] at the second memory device 604B. Since the second memory device 604B is no longer in a "recently reset" state, the second memory device 604B recognizes that the command is not intended for itself. Consequently, the second memory device 604B retransmits the received command on the Data bus output pins Q[0:n]. The command is received on the Data bus input pins D[0:n] at the third memory device 604C.

Upon receiving the "Set TDA to X" command from the second memory device 604B, the third memory device 604C recognizes that it is prepared to accept the command and, according to the command, overwrites its internal TDA register with the value X, which, in this case, is "2". As the "Set TDA to X" command is a special command, the third memory device 604C does not transmit the command on the Data bus output pins Q[0:n].

Subsequently, the controller 602 determines (step 706) whether an echo of the Set TDA to X command sent in step 704 has been received. Where an echo has not been received, the controller 602 increments (step 708) the operand.

The controller 602 then transmits (step 704) a "Set TDA to X" command, with operand X="3". Since the first memory device 604A is no longer in a "recently reset" state, the first memory device 604A recognizes that the command is not intended for itself. Consequently, the first memory device 604A retransmits the received command on the Data bus output pins Q[0:n]. The command is received on the Data bus input pins D[0:n] at the second memory device 604B. Since the second memory device 604B is no longer in a "recently reset" state, the second memory device 604B recognizes that the command is not intended for itself. Consequently, the second memory device 604B retransmits the received command on the Data bus output pins Q[0:n]. The command is received on the Data bus input pins D[0:n] at the third memory device 604C. Since the third memory device 604C is no longer in a "recently reset" state, the third memory device 604C recognizes that the command is not intended for itself. Consequently, the third memory device 604C retransmits the received command on the Data bus output pins Q[0:n]. The command is received on the Data bus input pins D[0:n] at the controller 602.

Subsequently, the controller 602 determines (step 706) whether an echo of the Set TDA to X command sent in step 704 has been received. Where an echo has been received, the controller 602 can then determine (step 710) the quantity of memory devices 604 in the ring and can be confident that each memory device 604 has been configured with a target device address. In particular, the quantity of memory devices 604 in the ring is the value of the operand when the controller 602 receives an echo of the most recently transmitted Set TDA to X command. In the above example, the operand X=3 when the controller 602 receives an echo of the most recently transmitted command. Consequently, the controller 602 determines (step 710) that there are three memory devices 604.

Another determination made by the controller 602 upon receipt of an echo of the most recent Set TDA to X command is the data width for the ring. In particular, the controller 602 may determine (step 712) the data width for the ring based on the number of adjacent 1s received in the first clock cycle. Upon determining (step 712) the data width for the ring, the configuration method of FIG. 7 may be considered complete.

In the general case, the controller 602 continues transmitting (step 704) "Set TDA to X" commands, incrementing (step 708) the operand X each time, until the controller 602 determines (step 706) that an echo of the most recently transmitted command has been received.

The configuration method described in FIG. 7 allows a printed circuit board to be populated with memory devices that support the desired data width or larger data widths. On receiving the "Set TDA to X" command, a memory device supporting a larger data width will recognize that only a fraction of its Data bus inputs are received as "1"s, and will configure itself to operate in a narrower mode.

Another case arises when memory devices can only support a width narrower than the Data bus on the controller or printed circuit board. The controller will initialize the ring with a desired Data bus width. At some point the width of the "Set TDA to X" commands will be truncated. When the final "Set TDA to X" command is received at the controller inputs, it will be truncated to the narrowest width supported by memory devices in the ring. At this point the controller must reset the ring and retransmit "Set TDA to X" commands with the narrower width, to eliminate the possibility that a device supporting a wider width was positioned upstream of the narrowest device.

A final case arises when the controller wishes to set the operating Data bus width to a width narrower than the width supported by ring. In this case it can simply initialize the ring by transmitting "Set TDA to X" commands with the desired narrow width. Alternatively, the controller can dynamically change the width during operation depending on performance requirements. On initialization, the controller can determine the width supported by the ring to determine the range of possible adjustment.

In subsequent operation, each memory device 604 passes data received on the Data bus input pins D[0:n] through to the Data bus output pins Q[0:n], except in response to a read data command packet or a read register command packet. Upon receiving one of these read command packets, which read command packets are expected to include a read location address from which to read, the memory device 604 obtains data from the read location address. When transmitting the read command packet on the Data bus output pins Q[0:n], the memory device 604 inserts the data obtained from the read location address into the read command packet.

In one embodiment, the latency for read operations is fixed. Advantageously, when the latency for read operations is fixed, other memory devices 604 on the circuit can snoop the Data bus and understand when data is being transferred, so that the memory devices 604 will not confuse data obtained responsive to a read operation with actual instructions.

Figure 11:
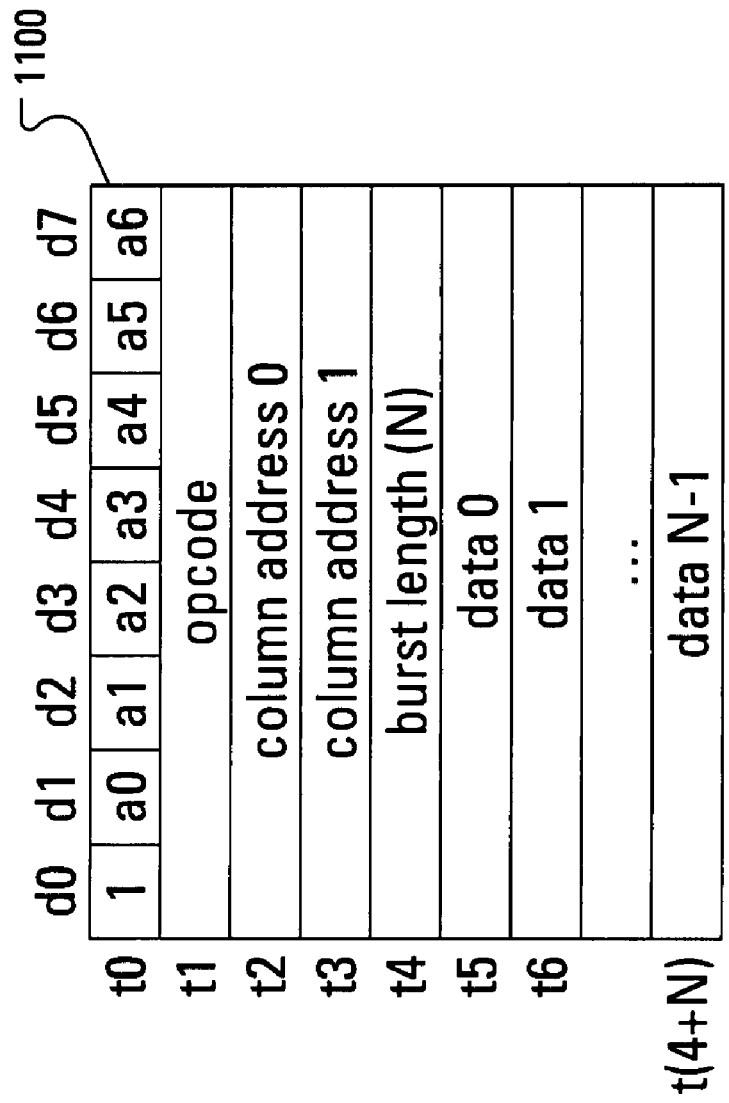
FIG. 11 illustrates an example 8-bit write command according to example embodiments.

An example of a write command packet 1100 is presented in FIG. 11. The write command packet 1100 is for use once the controller 602 has determined that the memory devices 604 are configured for 8-bit operation. The value "1" in the first bit (d0) allows the memory devices 604 to recognize the beginning of a command packet in an environment without strobes. The remaining bits of the first eight bits transferred at time t0 can accommodate a 7-bit TDA (a0-a6). As illustrated, the eight bits transferred at time t1 comprise an opcode. In this example, the opcode would identify a write command. The subsequent 16 bits, transferred at time t2 and t3, are identified in FIG. 11 as comprising a column address. Without strobes, a mechanism is required to allow a given memory device 604 to determine the end of a command packet. In one example mechanism, each command has a fixed data transfer length. In another example mechanism, a variable burst length parameter is inserted into the command. As shown in the write command packet 1100, a variable burst length parameter is transferred at time t4. The remainder of the write command packet 1100, transferred at time t5 through time t(4+N), contains the data to be written.

Figure 12:
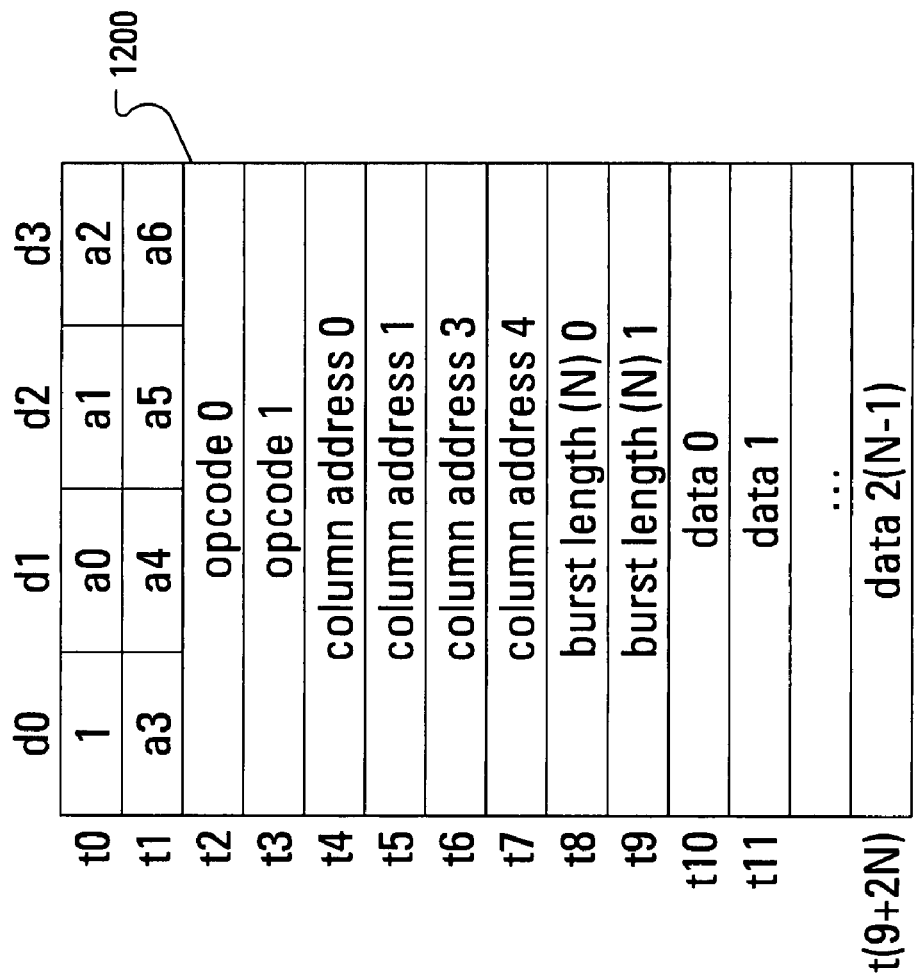
FIG. 12 illustrates an example 4-bit write command according to example embodiments.

A further example of a write command packet 1200 is presented in FIG. 12. The write command packet 1200 is for use once the controller 1002 of FIG. 10 has determined that the memory devices 1004 are configured for 4-bit operation. The value "1" in the first bit (d0) allows the memory devices 1004 to recognize the beginning of a command packet in an environment without strobes. The remaining bits of the first eight bits transferred at time t0 and time t1 can accommodate a 7-bit TDA (a0-a6). As illustrated, the eight bits transferred at time t2 and time t3 comprise an opcode. In this example, the opcode would identify a write command. The subsequent 16 bits, transferred at time t4 through time t7, are identified in FIG. 12 as comprising a column address. As shown in the write command packet 1200, a variable burst length parameter is transferred at time t8 and t9. The remainder of the write command packet 1200, transferred at time t10 through time t(9+2N), contains the data to be written.

Advantageously, the adaptations proposed herein for the controller 602 allow for significant pin count reduction to be achieved at the cost of a minor reduction in flexibility. In known memory devices adapted for ring-based arrangements, there have been a total of four strobe pins on each device: a Data Strobe In (DSI) pin; a Data Strobe Out (DSO) pin; a Command Strobe In (CSI) pin; and a Command Strobe Out (CSO) pin. For a memory device configured for a parallel clock, eliminating the strobe pins desirably reduces the number of non-data pins from eight to four. For a memory device configured for a source synchronous clock, eliminating the strobe pins desirably reduces the number of non-data pins from 11 to seven.

As will be apparent to a person of ordinary skill in the art, aspects of the present application are just as applicable to a multidrop bus topology as they are to a ring topology.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A memory device couplable to a data bus, the memory device comprising:
   a plurality of data input pins for receiving a pattern on said data bus;
   said memory device arranged to:
      self-configure a memory device data width, based on an operational data width indicated by said pattern, said memory device data width for use in subsequent read and write operations, and
   said memory device configured to:
      recognize when only a subset of said data input pins, less in number than all said data input pins, are receiving said pattern.

2. The memory device of claim 1 further comprising a device address register, said memory device further arranged to receive a further pattern on said data bus and, responsive to said receiving said further pattern, store, in said device address register, a device address indicated by said further pattern.

3. The memory device of claim 2 further comprising a reset input, said memory device further arranged to receive a signal on said reset input and, responsive to receiving said signal on said reset input, store, in said device address register, a default device address.

4. The memory device of claim 3 wherein said device address register comprises storage for a plurality of bits and said default device address is defined by each bit of said plurality of bits taking on an equivalent value.

5. The memory device of claim 4 wherein said equivalent value comprises "1".

6. The memory device of claim 1 further arranged to receive a clock signal from a controller of a plurality of memory devices and transmit, to a further memory device among said plurality of memory devices, said clock signal.

7. The memory device of claim 1 further arranged to receive a clock signal from a preceding memory device among a plurality of memory devices arranged in a ring and transmit, to a following memory device among said plurality of memory devices, said clock signal.

8. The memory device of claim 1 wherein when said memory device recognizes that only said subset of the data input pins are receiving said pattern, then said memory data width is a smaller data width than a largest data width otherwise supported by said memory device.

9. A method of operation for a memory device couplable to a data bus, the method comprising:
   receiving, via a plurality of data input pins, a pattern on said data bus; and
   based on an operational data width indicated by said pattern, self-configuring a memory device data width of said memory device, said memory device data width for use in subsequent read and write operations, and
   when only a subset of said data input pins, less in number than all said data input pins, are receiving said pattern, said self-configuring includes recognizing that only said subset of the data input pins are receiving said pattern.

10. The method of claim 9 further comprising:
    receiving a further pattern on said data bus; and
    responsive to said receiving said further pattern, storing, in said device address register, a device address indicated by said further pattern.

11. The method of claim 10 further comprising:
    receiving a signal on a reset input; and
    responsive to said receiving said signal on said reset input, storing, in said device address register, a default device address.

12. The method of claim 11 wherein said device address register comprises a plurality of bits and said default device address is defined by each bit of said plurality of bits taking on an equivalent value.

13. The method of claim 12 wherein said equivalent value comprises "1".

14. The method of claim 9 further comprising:
    receiving a clock signal from a controller of a plurality of memory devices; and
    transmitting, to a further memory device among said plurality of memory devices, said clock signal.

15. The method of claim 9 further comprising:
    receiving a clock signal from a preceding memory device among a plurality of memory devices arranged in a ring; and
    transmitting, to a following memory device among said plurality of memory devices, said clock signal.

16. The method of claim 9 wherein said memory data width is a smaller data width than a largest data width otherwise supported by said memory device when only said subset of the data input pins are receiving said pattern.

* * * * *

UNITED STATES PATENT AND TRADEMARK OFFICE
CERTIFICATE OF CORRECTION

| | | |
|---|---|---|
| PATENT NO. | : 8,122,202 B2 | Page 1 of 1 |
| APPLICATION NO. | : 11/843024 | |
| DATED | : February 21, 2012 | |
| INVENTOR(S) | : Gillingham | |

It is certified that error appears in the above-identified patent and that said Letters Patent is hereby corrected as shown below:

On the Title Page, Item [73] should read: MOSAID Technologies Incorporated, Kanata, Ontario (CA)

Signed and Sealed this
Sixteenth Day of September, 2014

Michelle K. Lee
*Deputy Director of the United States Patent and Trademark Office*